(12) United States Patent
Kremerman

(10) Patent No.: US 9,724,834 B2
(45) Date of Patent: Aug. 8, 2017

(54) ROBOT APPARATUS, DRIVE ASSEMBLIES, AND METHODS FOR TRANSPORTING SUBSTRATES IN ELECTRONIC DEVICE MANUFACTURING

(71) Applicant: Applied Materials, Inc., Santa Clara, CA (US)

(72) Inventor: Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 42 days.

(21) Appl. No.: 14/583,460

(22) Filed: Dec. 26, 2014

(65) Prior Publication Data

US 2015/0190933 A1 Jul. 9, 2015

Related U.S. Application Data

(60) Provisional application No. 61/923,701, filed on Jan. 5, 2014.

(51) Int. Cl.
*H01L 21/677* (2006.01)
*B25J 18/02* (2006.01)
(Continued)

(52) U.S. Cl.
CPC ............. *B25J 18/02* (2013.01); *B25J 9/042* (2013.01); *B25J 9/104* (2013.01); *B25J 17/02* (2013.01); *H01L 21/67706* (2013.01); *H01L 21/67742* (2013.01); *H01L 21/67748* (2013.01); *Y10T 74/20323* (2015.01)

(58) Field of Classification Search
CPC ...... H01L 21/67742; B25J 9/104; B25J 9/042
See application file for complete search history.

(56) References Cited

U.S. PATENT DOCUMENTS

| 6,105,454 A | 8/2000 | Bacchi et al. |
| 6,121,743 A | 9/2000 | Genov et al. |
| (Continued) | | |

FOREIGN PATENT DOCUMENTS

| CN | 1902031 A | 1/2007 |
| CN | 102452080 A | 5/2012 |
| (Continued) | | |

OTHER PUBLICATIONS

International Search Report and Written Opinion of International Application No. PCT/US2014/072438 mailed Apr. 13, 2015.
(Continued)

*Primary Examiner* — Gerald McClain
*Assistant Examiner* — Ronald Jarrett
(74) *Attorney, Agent, or Firm* — Dugan & Dugan, PC

(57) ABSTRACT

A substrate-transporting robot apparatus is disclosed. The robot apparatus may include an upper arm, a forearm independently rotatable relative to the upper arm, a wrist member independently rotatable relative to the forearm, and an end effector adapted to carry a substrate. In some aspects, the independent rotation is provided by a robot drive assembly having a second driving pulley mounted for rotation on a first driving pulley. In another aspect, robot drive assemblies including base-mounted and web-mounted pulleys are disclosed. Robot drive assemblies and operational methods are provided, as are numerous other aspects.

23 Claims, 14 Drawing Sheets

(51) Int. Cl.
*B25J 17/02* (2006.01)
*B25J 9/04* (2006.01)
*B25J 9/10* (2006.01)

(56) References Cited

U.S. PATENT DOCUMENTS

| | | | |
|---|---|---|---|
| 6,669,434 | B2 | 12/2003 | Namba et al. |
| 6,737,826 | B2 | 5/2004 | Gilchrist |
| 7,688,017 | B2 | 3/2010 | Hudgens |
| 7,927,062 | B2 | 4/2011 | Rice et al. |
| 8,016,542 | B2 | 9/2011 | Cox et al. |
| 8,061,232 | B2 | 11/2011 | Kroetz et al. |
| 8,264,187 | B2 | 9/2012 | Laceky et al. |
| 8,692,500 | B2 | 4/2014 | Laceky et al. |
| 8,777,547 | B2 | 7/2014 | Kremerman et al. |
| 8,784,033 | B2 | 7/2014 | Kremerman et al. |
| 2002/0066330 | A1 | 6/2002 | Namba et al. |
| 2002/0078778 | A1* | 6/2002 | Grover ............ B25J 9/042 74/490.03 |
| 2004/0001750 | A1 | 1/2004 | Kremerman |
| 2006/0099063 | A1 | 5/2006 | Pietrantonio et al. |
| 2009/0016833 | A1* | 1/2009 | Elrod ............ B23Q 5/043 408/102 |
| 2010/0178146 | A1* | 7/2010 | Kremerman ............ B25J 9/042 414/744.5 |
| 2011/0135437 | A1 | 6/2011 | Takeshita et al. |
| 2013/0115028 | A1 | 5/2013 | Kremerman et al. |
| 2013/0149076 | A1 | 6/2013 | Cox et al. |
| 2013/0272823 | A1 | 10/2013 | Hudgens et al. |
| 2014/0010625 | A1 | 1/2014 | Hudgens et al. |
| 2014/0150592 | A1 | 6/2014 | Kremerman |
| 2014/0154038 | A1* | 6/2014 | Hudgens ............ H02K 5/128 414/744.5 |
| 2014/0271055 | A1 | 9/2014 | Weaver et al. |
| 2014/0286736 | A1 | 9/2014 | Kremerman et al. |
| 2014/0286741 | A1 | 9/2014 | Kremerman et al. |

FOREIGN PATENT DOCUMENTS

| | | |
|---|---|---|
| CN | 103170986 A | 6/2013 |
| CN | 103240732 A | 8/2013 |
| JP | 2002-158272 | 5/2002 |
| WO | WO 2010/080983 A2 | 7/2010 |
| WO | WO 2013/067214 | 5/2013 |
| WO | WO 2013/154863 | 10/2013 |

OTHER PUBLICATIONS

International Preliminary Report on Patentability of International Application No. PCT/US2014/072438 mailed Jul. 14, 2016.

Chinese Search Report of Chinese Application No. 201480070637.6 dated Mar. 14, 2017.

\* cited by examiner

ROBOT APPARATUS, DRIVE ASSEMBLIES, AND METHODS FOR TRANSPORTING SUBSTRATES IN ELECTRONIC DEVICE MANUFACTURING

RELATED APPLICATION

The present application claims priority to U.S. Provisional Application No. 61/923,701 filed Jan. 5, 2014, and entitled "ROBOT APPARATUS, DRIVE ASSEMBLIES, AND METHODS FOR TRANSPORTING SUBSTRATES IN ELECTRONIC DEVICE MANUFACTURING", which is hereby incorporated by reference herein for all purposes.

FIELD

The present invention relates to electronic device manufacturing, and more specifically to robot apparatus, drive assemblies, and methods for transporting substrates.

BACKGROUND

Conventional electronic device manufacturing systems may include multiple process chambers and load lock chambers. Such chambers may be included in cluster tools, for example, where substrates may be transported between the respective process chambers and load lock chambers. These systems may employ a robot apparatus to move the substrates between the various chambers, and may reside in the transfer chamber. During such movements, a substrate may be supported on an end effector (sometimes referred to as a "blade") that is coupled to a wrist member. Efficient and precise transport of substrates between the various system chambers may be desired for system throughput, thereby possibly lowering overall operating costs. In some embodiments, the ability to independently articulate (e.g., yaw) the end effector is desired, such that offset, non-radial, chambers may be accessed, for example.

Accordingly, robot apparatus, assemblies and methods having yaw capability for efficient and precise movement of the substrates are desired.

SUMMARY

In one aspect a robot apparatus is provided. The robot apparatus includes an upper arm including an upper arm housing having an inboard end and outboard end, a forearm having a forearm housing coupled for rotation to the upper arm housing at the outboard end, a wrist member coupled for rotation to the forearm housing, an end effector coupled to the wrist member and configured and adapted to carry a substrate, and a drive assembly configured and adapted to cause independent rotation of the forearm relative to the upper arm, and independent rotation of the wrist member relative to the forearm, both in an X-Y plane, the drive assembly further including: a first driving pulley coupled for rotation to the upper arm housing, and a second driving pulley coupled for rotation to the first driving pulley.

In another aspect, a robot drive assembly is provided. The robot drive assembly is adapted to cause independent rotation of a forearm relative to an upper arm, and independent rotation of a wrist member relative to the forearm. the robot drive assembly includes a first driving pulley coupled for rotation to an upper arm housing of the upper arm, and a second driving pulley coupled for rotation to the first driving pulley.

In another aspect, a method of transporting a substrate within an electronic device processing system is provided. The method includes providing robot apparatus having an upper arm, a forearm, a wrist member, and an end effector, the end effector adapted to carry a substrate, providing a robot drive assembly adapted to cause independent rotation of a forearm relative to an upper arm, and independent rotation of a wrist member relative to the forearm, driving a first driving pulley coupled for rotation to an upper arm housing of the upper arm, and driving a second driving pulley coupled for rotation to the first driving pulley.

In another aspect, a robot drive assembly is provided. The robot drive assembly is adapted to cause independent rotation of a forearm relative to an upper arm, and independent rotation of a wrist member relative to the forearm. The robot drive assembly includes a first driving pulley coupled for rotation to a first pilot of upper arm housing of the upper arm, a second driving pulley coupled for rotation to the first driving pulley, a lower pilot and an upper pilot extending from a web of an outboard end of the upper arm housing, a first driven pulley coupled for rotation to the lower pilot and coupled to the first driving pulley by a first transmission member, a second driving pulley coupled for rotation to the upper pilot, coupled to the second driving pulley by a second transmission member, the second driving pulley attached to the forearm, and a transfer shaft coupled to the first driven pulley and a wrist member driving pulley.

In another aspect, a robot drive assembly is provided. The robot drive assembly is adapted to cause independent rotation of a forearm relative to an upper arm, and independent rotation of a wrist member relative to the forearm in a robot apparatus. The robot drive assembly includes a first pilot coupled to and extending away from a base of an upper arm housing, a first driving pulley coupled for rotation to the first pilot, a second pilot coupled to and extending away from a web of the upper arm housing, and a second driving pulley coupled for rotation to the second pilot.

In yet another aspect, a robot apparatus is provided. The robot apparatus includes an upper arm including an upper arm housing having an inboard end and outboard end, a forearm having a forearm housing coupled for rotation to the upper arm housing at the outboard end, a wrist member coupled for rotation to the forearm housing, an end effector coupled to the wrist member and configured and adapted to carry a substrate, and a robot drive assembly configured and adapted to cause independent rotation of the forearm relative to the upper arm, and independent rotation of the wrist member relative to the forearm, both in an X-Y plane, the robot drive assembly further including: a first pilot coupled to and extending away from a base of the upper arm housing, a first driving pulley coupled for rotation to the first pilot, a second pilot coupled to and extending away from a web of the upper arm housing, and a second driving pulley coupled for rotation to the second pilot.

Still other aspects, features, and advantages of the present invention may be readily apparent from the following detailed description by illustrating a number of example embodiments and implementations, including the best mode contemplated for carrying out the present invention. The present invention may also be capable of other and different embodiments, and its several details may be modified in various respects, all without departing from the scope of the present invention. Accordingly, the drawings and descriptions are to be regarded as illustrative in nature, and not as restrictive. The drawings are not necessarily drawn to scale. The invention is to cover all modifications, equivalents, and alternatives falling within the scope of the invention.

BRIEF DESCRIPTION OF THE DRAWINGS

The invention will be better understood by referring to the detailed description taken in conjunction with the following drawings.

DESCRIPTION

Figure 2:
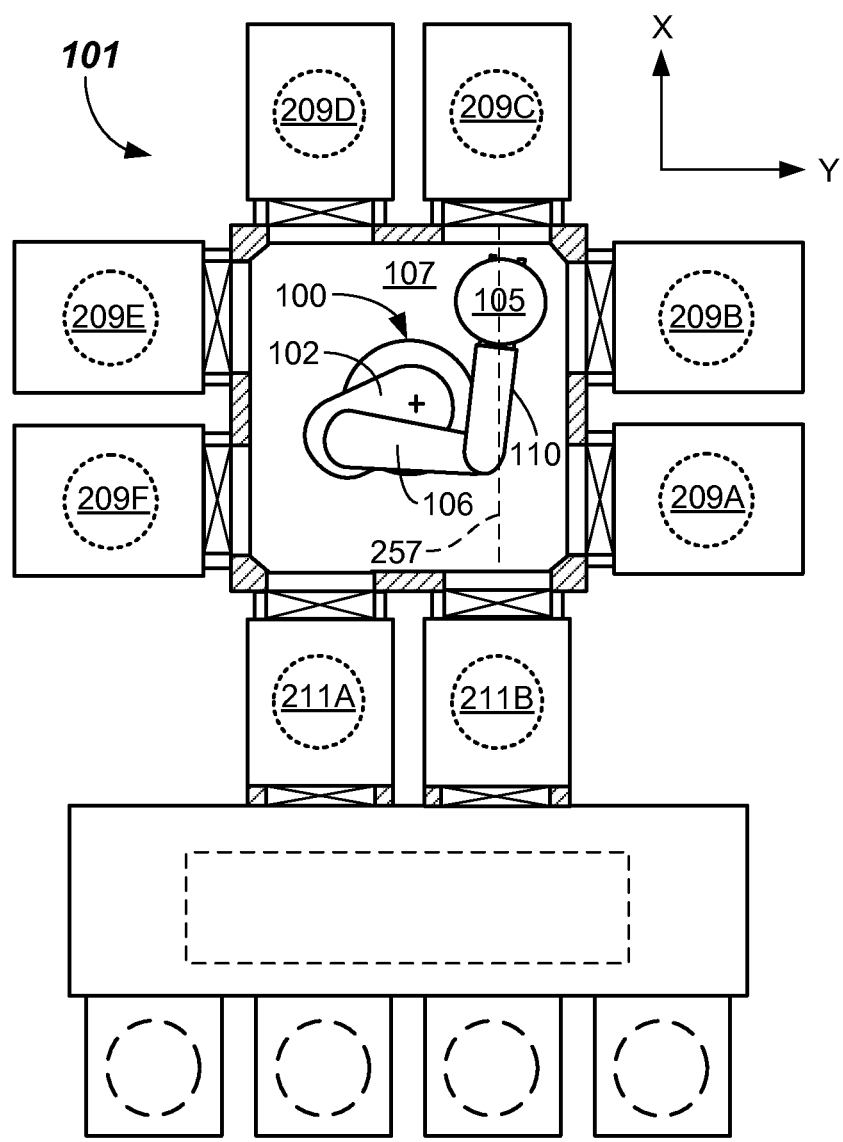
FIG. 2 illustrates a top plan view (with top removed) of an embodiment of a substrate processing system including a robotic apparatus according to embodiments.
Figure 3:
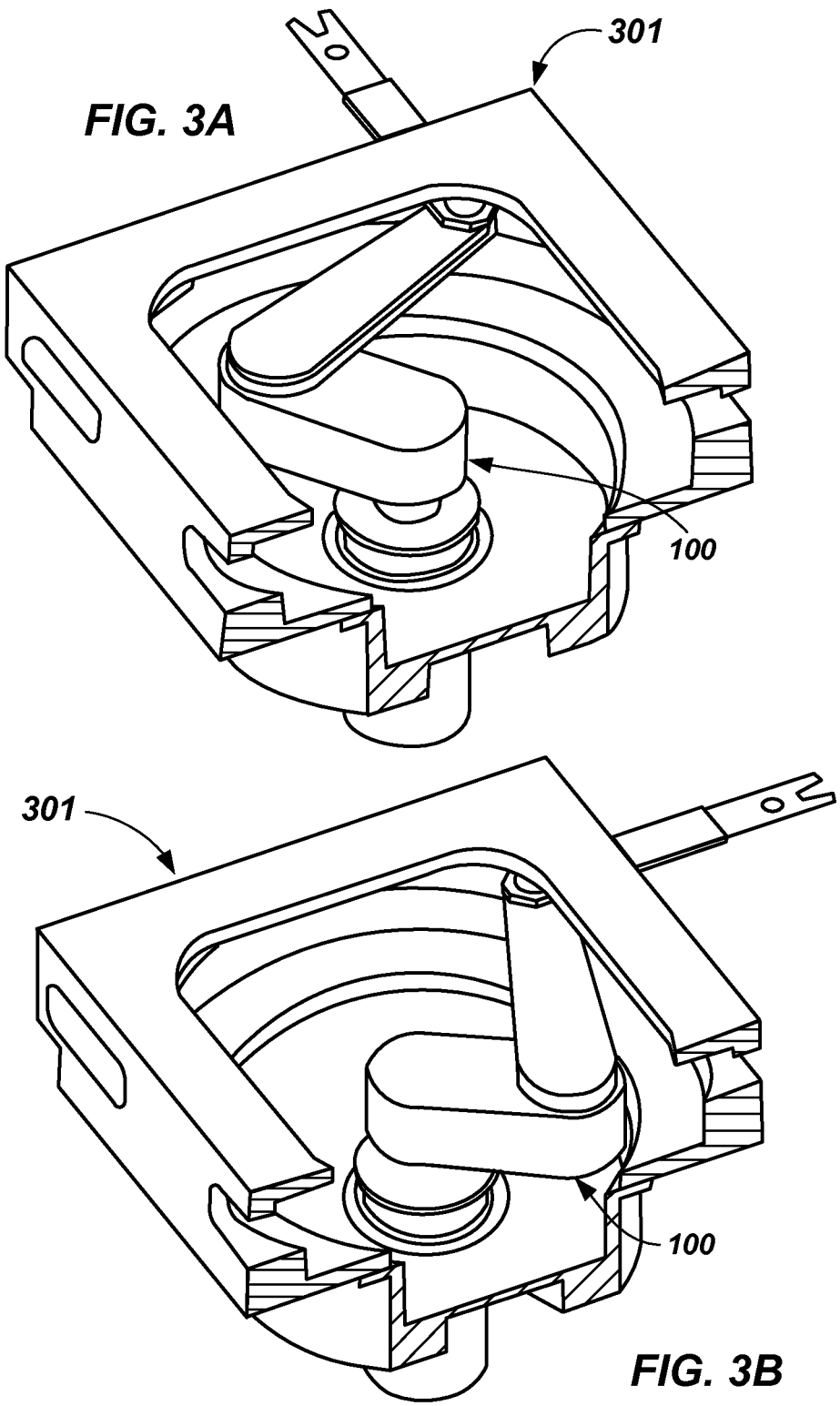
FIGS. 3A and 3B illustrate perspective views of an embodiment of a substrate processing system (with chambers removed) of various configurations enabled by a robotic apparatus including independent forearm and wrist member control according to embodiments.

Electronic device manufacturing may utilize robotic apparatus for movement of substrates between locations within the substrate manufacturing facility. For example, a robot apparatus may reside in a transfer chamber and may be used to transfer one or more substrates (e.g., silicon wafers, glass plates, masks, or the like) between various processing chambers and/or load lock chambers of a processing tool. In many instances, such process and/or load lock chambers may be operated under a vacuum. Accordingly, robot apparatus may likewise need to be positioned in, and be able to operate within, a vacuum environment. In some cases, the robot apparatus may be designed to have articulation capability to be able to access non-radial chambers (e.g., offset chambers, i.e., those offset from the shoulder axis of the robot) such as shown in FIG. 2. Moreover in order to reduce an overall size of the transfer chamber, robots having a small operating envelope may be desirable.

In accordance with one or more embodiments of the invention, a robot apparatus is provided with an ability to independently articulate a forearm and a wrist member thereof. In particular, the wrist member may be adapted for independent rotation relative to the forearm, and the forearm may be adapted for independent rotation relative to an upper arm of the robot apparatus. Adding additional articulation functionality may enable the overall size of the robot and thus the transfer chamber to be made relatively smaller, and also allow offset chambers (chambers whose facet lines are non-focalized with the shoulder axis of the upper arm of the robot apparatus. Accordingly, robot motion may be carried out in a smaller space envelope, such that robotic transportation of substrates within the substrate processing system may require a smaller operating envelope.

Thus, robot apparatus including enhanced functionality in terms of increased degrees of rotational freedom and/or independent rotational capability are sought after, especially robot apparatus with increased degrees of rotational freedom in an X-Y plane.

In another embodiment of the present invention, a robot apparatus having improved functionality is provided. The robot apparatus includes an upper arm, a forearm coupled to the upper arm, and a wrist member coupled to the forearm. The wrist member may include an end effector adapted to carry a substrate, which may be processed in one or more process chambers that are accessible by the robot apparatus. The wrist member is adapted for independent rotation in an X-Y plane relative to the forearm, and the forearm is adapted for independent rotation in an X-Y plane relative to the upper arm. The X-Y plane is a plane parallel to a plane in which the substrates lie during processing. As a result, the robot apparatus may be advantageously adapted to provide a wrist member, which may translate in an X-Y plane but also impart yaw movement to the wrist member in the X-Y plane. Accordingly, such yaw motion may be imparted to the end effector. Thus, the robot apparatus may adeptly service substrate processing systems including chambers where a facet line of one or more of the chambers is non-focalized to a common radial center point of the transfer chamber. Furthermore, as many as six or more process chambers may be serviced by a single robot, for example, in a relatively small special envelope in such non-focalized systems.

In one or more embodiments, a drive assembly for a robot apparatus is provided. The drive assembly is configured to be operable to independently rotate the forearm and the wrist member. In particular, in accordance with another aspect, the drive assembly includes a configuration that allows pre-tensioning of the transmission members (e.g., drive belts).

Further details of example embodiments of the invention are described below with reference to FIGS. 1A-5.

FIGS. 1A-1H illustrates various views of an example embodiment of a robot apparatus 100, a drive assembly 115, and components according to the present invention. The robot apparatus 100 may include an assembly of robot arms, such as an upper arm 102, forearm 106, and wrist member 110, a drive motor assembly 114, and a drive assembly 115. The drive motor assembly 114, which may include a base 103 (or flange), which may be adapted to mount the robot apparatus 100 to a wall (e.g., a floor—only a portion shown in FIG. 1A) for operation within a transfer chamber 107 (the walls of which are delineated by dotted lines in FIG. 1A).

The various arms (upper arm 102, forearm 106, and wrist member 110) of the robot apparatus 100 may be operable within a transfer chamber 107. The transfer chamber 107 may be a vacuum chamber, for example. Robot apparatus 100 may be adapted to transport one or more substrates 105 between various chambers, such as process chambers 209A-209F, which may be coupled to the transfer chamber 107, as shown in FIG. 2. In particular, the robot apparatus 100 may be adapted to transfer substrates 105 between one or more load lock chambers 211A, 211B and one or more process chambers 209A-209F of an electronic device processing system 101 that are configured and adapted for processing substrates 105.

Now referring to FIGS. 1A through 1H, the robot apparatus 100 includes an upper arm 102 that includes an upper arm housing 104 having an inboard end 104A and outboard end 104B. Upper arm housing 104 may include a removable top plate 104T and detachable base portion 123D. The upper arm 102 is adapted to rotate in an X-Y plane (See FIG. 2) relative to a base 103 about a shoulder axis. The X-Y plane is a plane of operation of the robot apparatus 100 for feeding substrates 105 between the various process chambers 209A-209F, and load lock chambers 211A, 211B; the plane being perpendicular to the shoulder axis 113, which may be the Z-axis of the robot apparatus 100.

The forearm 106 may include a forearm housing coupled for rotation to the upper arm housing 104 at the outboard end 104B. Forearm 106 may include an inboard end and an outboard end, and the inboard end may be coupled to the upper arm 102 at an elbow axis 117. The forearm 106 may be adapted to rotate in the X-Y plane relative to the upper arm 102 about the elbow axis 117 at its inboard end, for example. The wrist member 110 may be coupled to the forearm 106 at an outboard end thereof. Wrist member 110 may be adapted for rotation in the X-Y plane relative to the forearm 106 about a wrist axis 119. The wrist axis 119 may be located at the outboard end of the forearm 106. An end effector 112 may be coupled to, or integral with, the wrist member 110 and may be adapted to carry one or more substrates 105 between respective chambers, such as process chambers 209A-209F, and load lock chambers 211A, 211B of the electronic device processing system 101, for example. In the depicted embodiment, the end effector 112 and the wrist member 110 are shown as separate connected articles. However, in other embodiments, the wrist member 110 and end effector 112 may optionally be integral with one another.

In accordance with one embodiment of the invention, the robot apparatus 100 may include a drive assembly 115, which may allow for the wrist member 110, and thus the end effector 112, to carry out a yaw motion in the X-Y plane. This yaw motion may be carried out by the robot apparatus 100 independent of the rotation of the upper arm 102 and the forearm 106, for example. Thus, as shown in FIG. 2 and FIGS. 3A and 3B, the wrist member 110 may be yawed inside the electronic device processing system 301 such that offset chambers (i.e., non-focalized chambers) may be readily accessed thereby. Process chambers and top cover of the transfer chamber have been removed in FIGS. 3A-3B.

Moreover, in accordance with another embodiment of the invention, independent rotation of each of the upper arm 102, forearm 106, and wrist member 110 may be accomplished. For example, independent rotation of the upper arm 102 about the shoulder axis 113 in the X-Y plane may be provided in both the clockwise or counterclockwise directions. In particular, the rotation of the upper arm 102 may be 0 degrees+/−up to about 360 degrees, or more.

Independent rotation of the forearm 106 about the elbow axis 117 in the X-Y plane may also be provided in both the clockwise or counterclockwise directions. In particular, the forearm 106 may be rotated relative to the upper arm 102 by an angle of up to about +/−140 degrees, for example. As such, independent of the angular rotation which the upper arm 102 is undergoing, the forearm 106 may be rotated in the same direction, opposite direction, or held stationary relative to the upper arm 102. Moreover, the forearm 106, may be rotated faster than, slower than, or at the same angular rate as the upper arm 102.

Likewise, rotation of the wrist member 110 about the wrist axis 119 may be provided in a clockwise or counterclockwise direction relative to the forearm 106. In particular, an angle of rotation of the wrist member 110 relative to the forearm 106 in the X-Y plane may be up to about +/−140 degrees, for example.

Accordingly, with the addition of yaw capability in the X-Y plane as compared to a conventional SCARA robot, and/or the ability to independently rotate the wrist member 110 relative to the forearm 106, process chambers 209A-209F, which are non-focalized, of the electronic device processing system 101 (FIG. 2) may be reached and serviced. In such process chambers (e.g., process chamber 209C), a normal vector (shown as a dotted line) from a facet to which the process chamber 209C is connected is not focalized to a common center in the transfer chamber 107. Of course, it should be recognized that embodiments of robot apparatus 100 may find utility for accessing and servicing other types of process chambers, such as focalized process chambers. For example, the robot apparatus 100 may be used in a factory interface, and may be adapted to transfer substrates between a load port and a load lock chamber.

Again referring to FIGS. 1A-1H, more details of the robot apparatus 100 and the drive assembly 115 thereof are described. Rotation of the upper arm 102 of the robot apparatus 100 in the X-Y plane relative to the base 103 may be accommodated by the drive motor assembly 114. In the depicted embodiment, the drive motor assembly 114 may include three drive motors 114A, 114B, 114C (FIG. 1A) that couple via drive shafts 121A, 121B, 121C to the upper arm 102 and first and second driving pulleys 116, 118, respectively. One or more support bearings may be provided between the motor housing 114H and the drive shaft 121A of first drive motor 114A. Drive shaft 121A is coupled to the upper arm 102, and rotation of the drive shaft 121A via action of the first drive motor 114A rotates the upper arm 102. Drive shaft 121A may extend along the Z axis direction. The support bearing may be any suitable member for allowing rotation and restraining vertical motion (Z motion) along the shoulder axis 113. The support bearing may be a sealed ball bearing, for example. Other types of bearings or bushings may be used.

In some embodiments, some limited Z-axis motion capability may be provided such that a put and a pick of a substrate 105 may be accomplished in a substrate processing system where stationary lift pins or stationary substrate platforms are provided in the process chambers. Such Z-axis capability may be provided by a conventional Z-axis motive device (not shown) coupled to the motor housing 114H and causing all of the upper arm 102, forearm 106, wrist member 110 and end effector 112 to translate in the Z direction by a sufficient amount to accommodate a pick or put of the substrate 105, for example.

In the depicted embodiment, the drive motors 114A, 114B, 114C are electric motors having a rotor (e.g., a series of magnets) that may be attached to the respective drive shafts 121A, 121B, 121C and stators (a series of windings) that may be attached to the motor housing 114H, for example. Other constructions of the drive motors 114A, 114B, 114C may be used. In particular, in some embodiments, the stators may be provided in an area which is not under a vacuum, under a lesser vacuum than the transfer chamber 107, or at least physically separated from the transfer chamber 107. Any suitable conventional three-axis drive motor assembly 114 may be used.

Figure 1A:
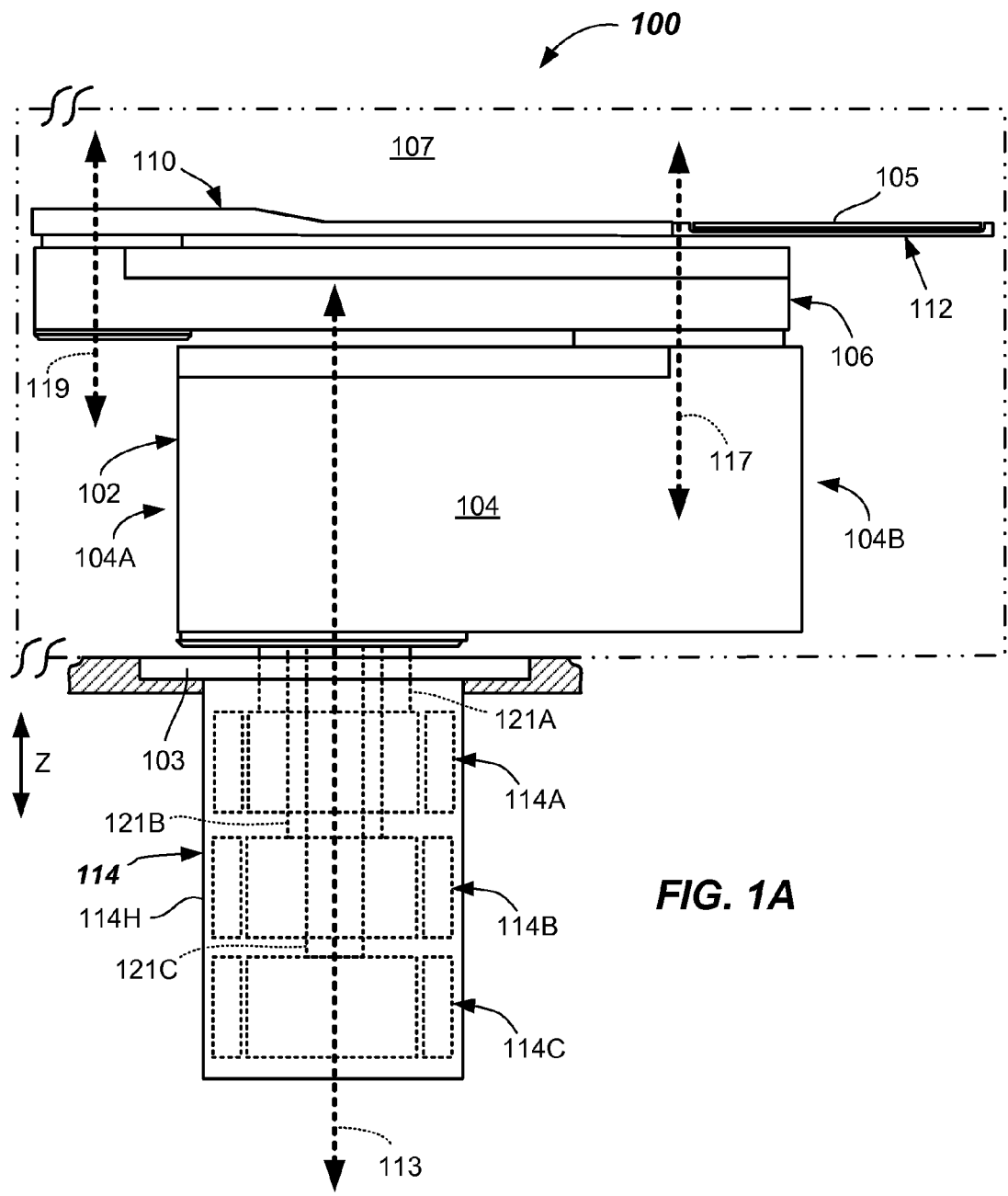
FIG. 1A illustrates a side plan view of a robot apparatus according to embodiments.
Figure 1B:
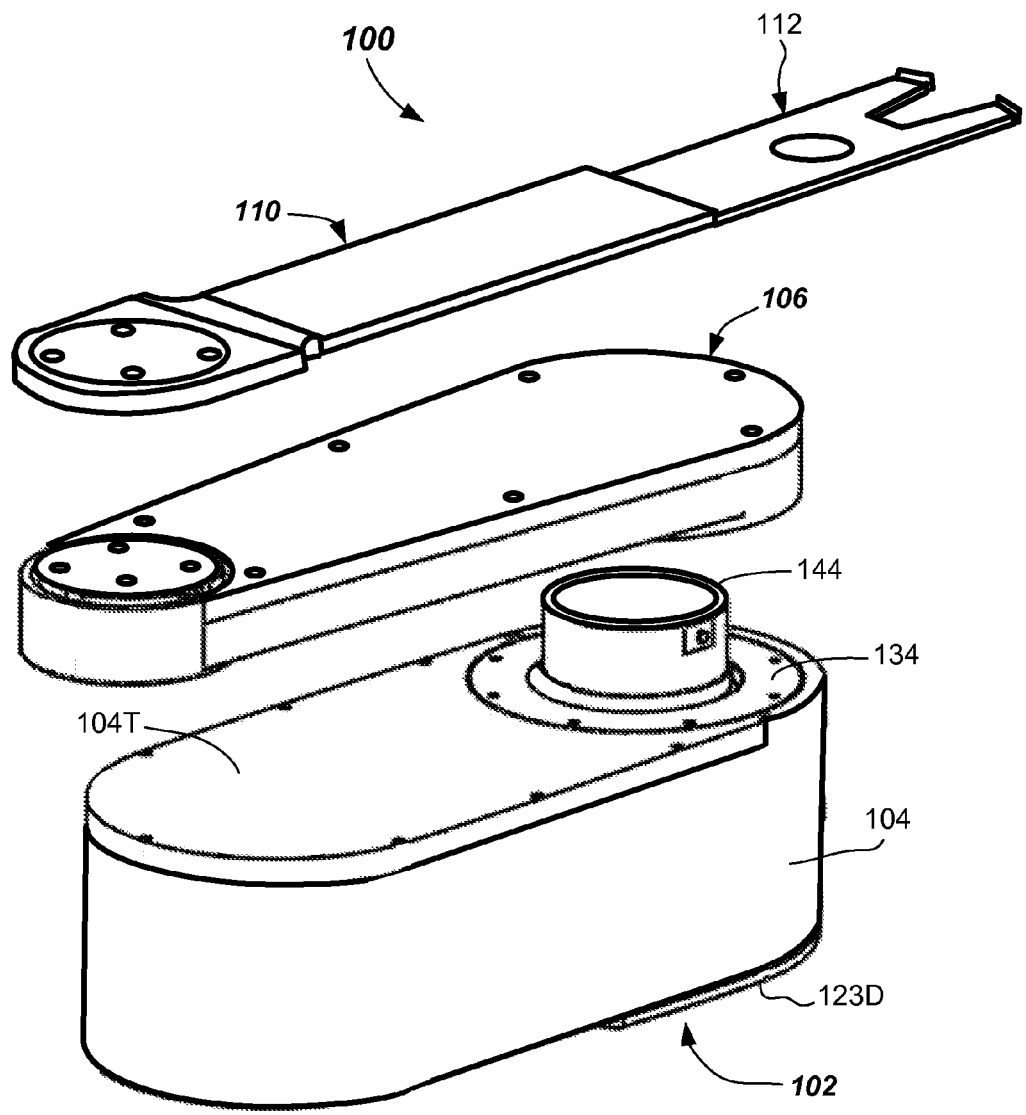
FIG. 1B illustrates an exploded perspective view of some components of a robot apparatus according to embodiments.
Figure 1C:
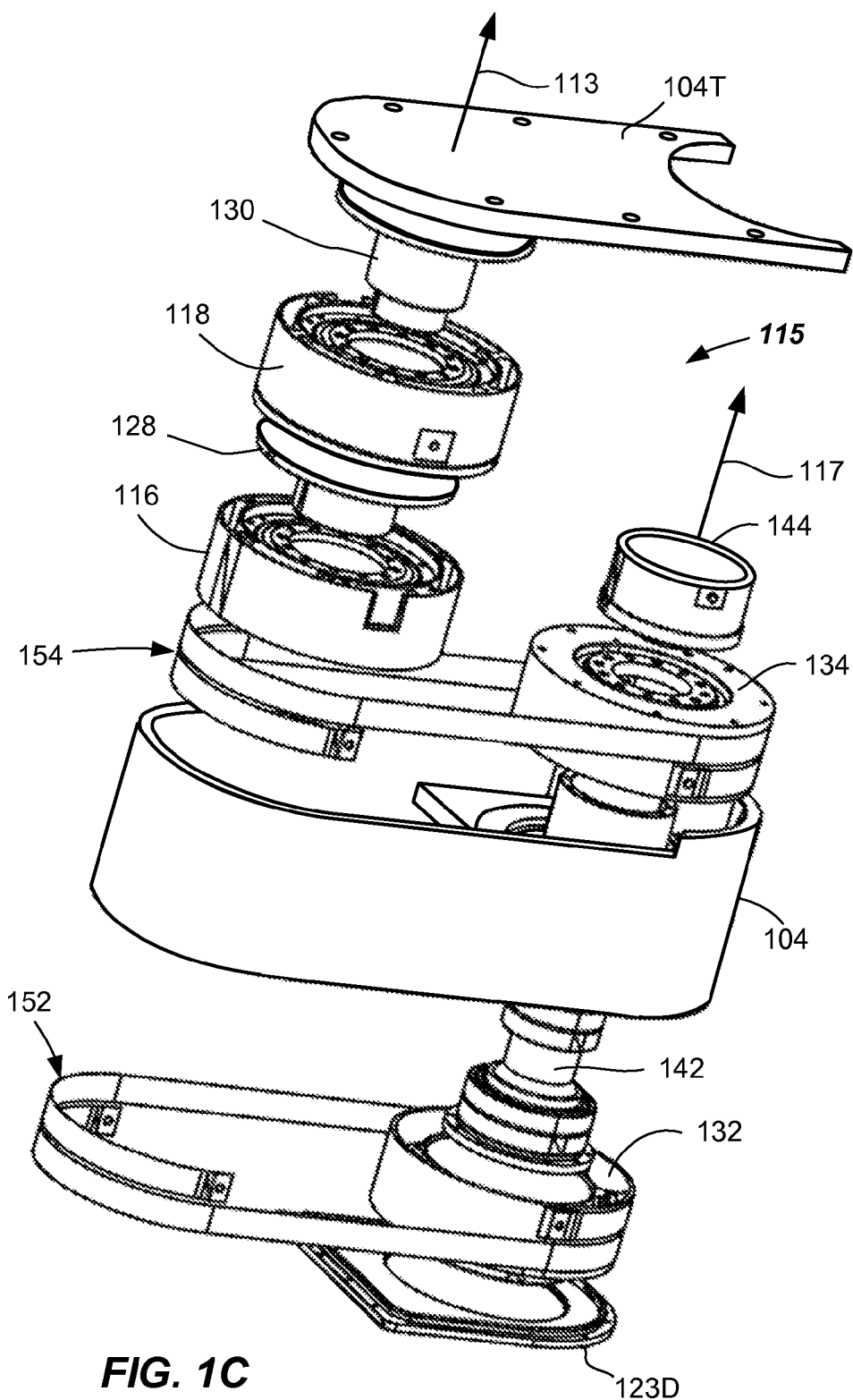
FIG. 1C illustrates an exploded perspective view of various components of a drive assembly of a robot apparatus according to embodiments.
Figure 1D:
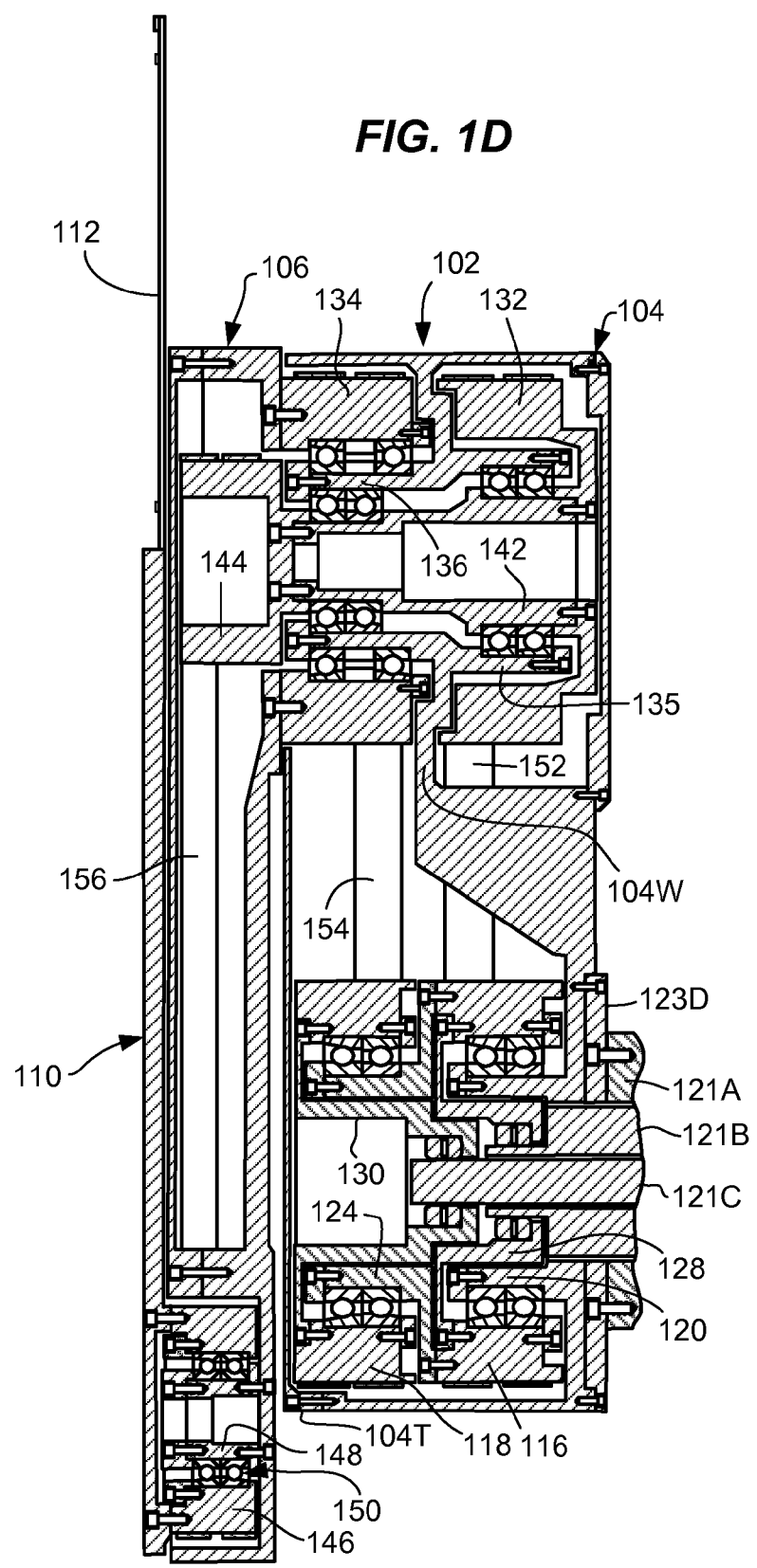
FIG. 1D illustrates a cross-sectional side view of a robot apparatus according to embodiments.
Figure 1E:
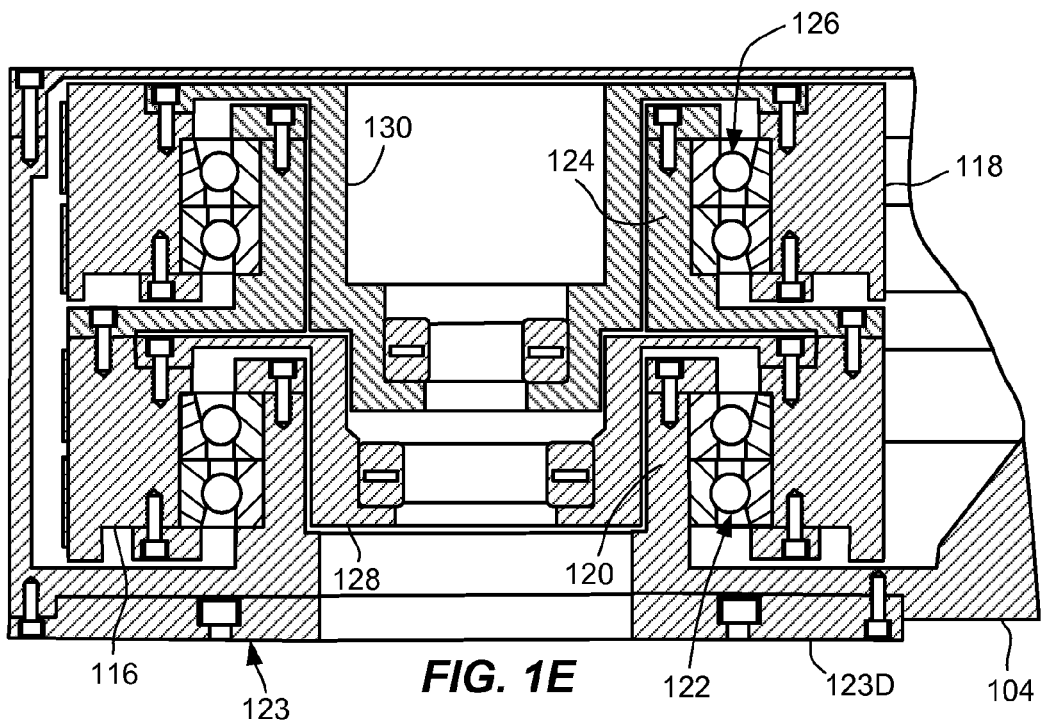
FIG. 1E illustrates a partial cross-sectional view of an inboard portion of a drive assembly of a robot apparatus according to embodiments (with drive shafts not shown).

The drive assembly 115 is configured and adapted to cause independent rotation of the forearm 106 relative to the upper arm 102, and independent rotation of the wrist member 110 relative to the forearm 106, both in an X-Y plane, as best shown in FIG. 1C-1H. The drive assembly 115 may include a first driving pulley 116 coupled for rotation to the upper arm housing 104 about the shoulder axis 113. Upper arm housing 104 comprises a first pilot 120, wherein the first driving pulley 116 is coupled for rotation to the first pilot 120 by a first bearing 122 as shown in FIG. 1E. First pilot 120 may be integral to the upper arm housing 104 and extends away from a base 123 (FIG. 1E) of the upper arm housing 104. The first driving pulley 116 may be configured and adapted to be coupled to a second drive shaft 121B extending from second drive motor 114B by a first shaft connector 128. First shaft connector 128 may extend overtop of the first pilot 120 of the upper arm housing 104 and couple to a top of the first driving pulley 116.

In the depicted embodiment, the second driving pulley 118 is coupled for rotation to the first driving pulley 116. In particular, a second pilot 124 attaches to the first driving pulley 116, such as at a top thereof. Second driving pulley 118 is coupled for rotation to the second pilot 124 by a second bearing 126. A second shaft connector 130 may extend overtop of the second pilot 124 and couple to a top of the second driving pulley 118. A third drive shaft from the third drive motor 114C may couple to the second shaft connector 130.

Figure 1F:
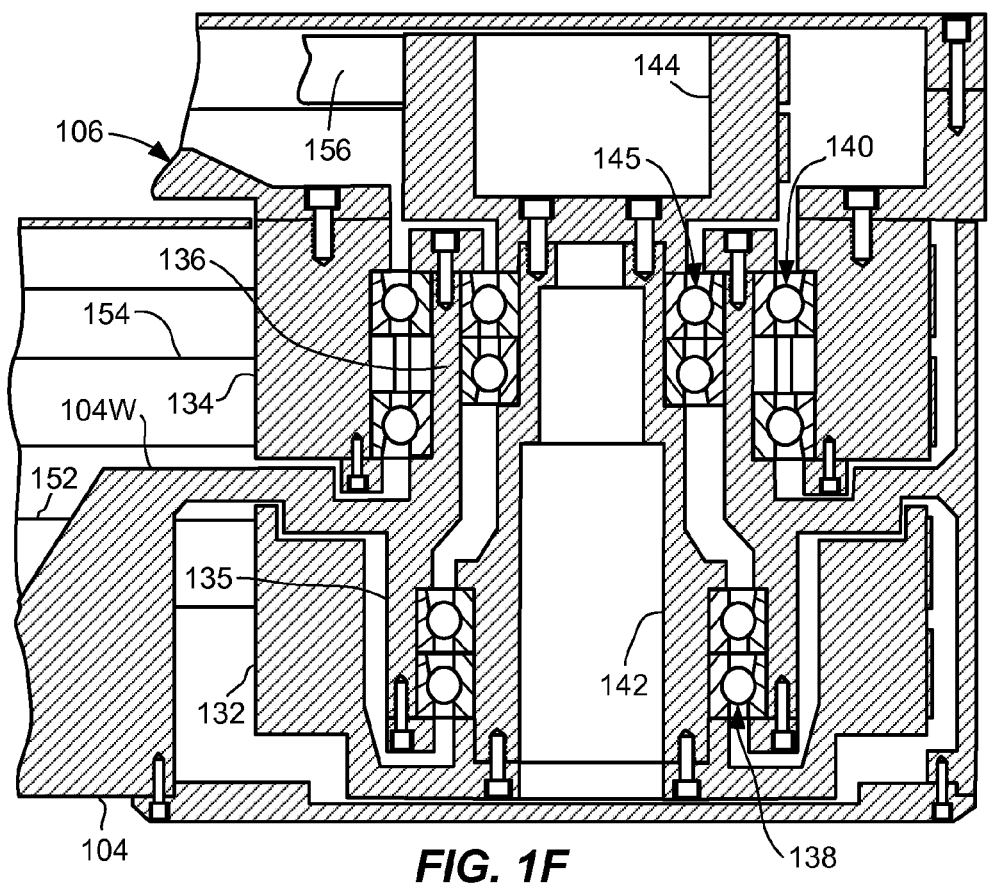
FIG. 1F illustrates a partial cross-sectional view of an outboard portion of a drive assembly of a robot apparatus according to embodiments.
Figure 1G:
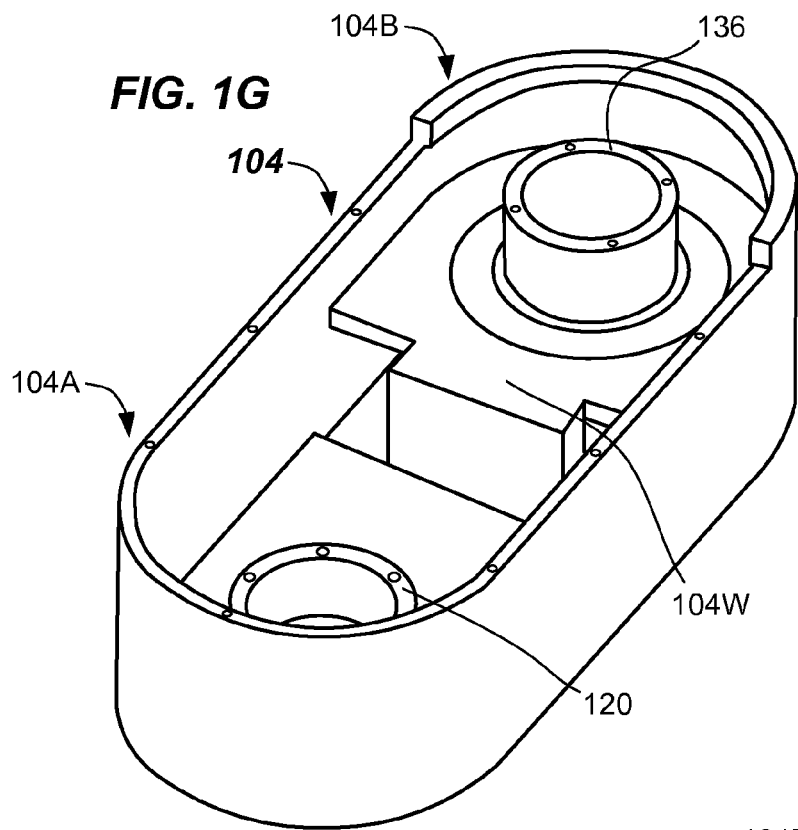
FIGS. 1G-1H illustrate top and bottom views, respectively, of an upper arm housing of a robot apparatus according to embodiments.
Figure 1H:
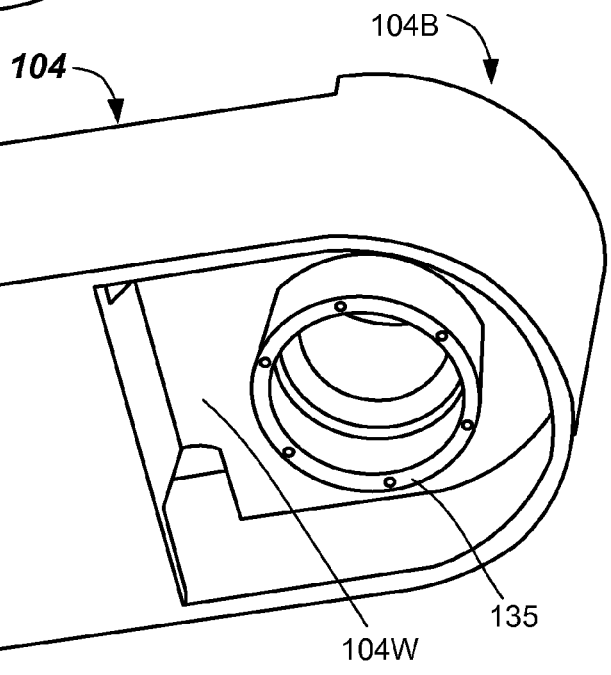

As best shown in FIG. 1F, the drive assembly 115 may include a first driven pulley 132 and a second driven pulley 134. In the depicted embodiment, the outboard end 104B of the upper arm housing 104 includes a web 104W, and a first outer pilot 135 (lower pilot) and a second outer pilot 136 (upper pilot) extend from the web 104W. First outer pilot 135 and second outer pilot 136 may extend downwardly and upwardly from the web 104W, respectfully. Web 104W may be integral with the rest of the upper arm housing 104 or a separate piece. The first driven pulley 132 is coupled for rotation to the first outer pilot 135, and the second driven pulley 134 is coupled for rotation to the second outer pilot 136. The coupling for rotation may be by suitable third and fourth bearings 138, 140. A transfer shaft 142 couples the first driven pulley 132 to a wrist member driving pulley 144. Transfer shaft 142 may be supported for rotation by both the first outer pilot 135 and the second outer pilot 136 by transfer shaft support bearings, such as the third bearing 138 and fifth bearing 145. Fifth bearing 145 may be coupled between the inside of the second outer pilot 136 and the transfer shaft 142. In the depicted embodiment, the inboard end of the forearm 106 is directly attached to the second driven pulley 134 such as by bolts or the like, and is rotated thereby.

As shown, a wrist member driven pulley 146 is attached to the wrist member 110. Wrist member driven pulley 146 is coupled for rotation to a forearm pilot 148 by a wrist member support bearing 150. In operation, the first driven pulley 132 is driven with a first transmission member 152 coupled to the first driving pulley 116. Likewise, second driven pulley 134 is driven with a second transmission member 154 coupled to the second driving pulley 118. First and second transmission members 152, 154 may be metal drive belts, for example, which may be pinned to the respective sides of first driving pulley 116, second driving pulley 118, first driven pulley 132, and second driven pulley 134.

In operation, rotation of the first driving pulley 116 about the shoulder axis 113 by second drive motor 114B drives the connected first driven pulley 132, which rotates the transfer shaft 142 and the coupled wrist member driving pulley 144. This rotates the wrist member 110 in the X-Y plane by connection to the wrist member driven pulley 146 through third transmission member 156. Each of the pulleys 116, 118, 132, 134, 144, 146 may be generally cylindrical pulleys.

Again referring to FIGS. 1A-1F, the forearm 106 of the robot apparatus 100 may be independently rotated. Independent rotation may be provided by driving the second driving pulley 118 through the shoulder axis 113 with third drive motor 114C, which in turn drives the second driven pulley 134 through the second transmission member 154. This causes rotation of the forearm 106 about the elbow axis 117. Rotation of the upper arm 102 may be by direct action of the first drive motor 114A.

As should be recognized, the independent yaw of the wrist member 110 in the X-Y plane, independent rotation of the forearm 106 in the X-Y plane relative to the upper arm 102, and independent rotation of the upper arm 102 may allow a wide range of delivery paths to be used for delivering the substrate 105 to its intended destination. A wide variety of movements of the upper arm 102, forearm 106 and the wrist member 110 may be provided such that the size of the transfer chamber 107 for accomplishing transport of substrates 105 by the robot apparatus 100 may be minimized. This may reduce material costs, reduce overall size, and vacuum pumps may be made smaller.

Furthermore, enabling independent rotational motion of the upper arm 102, forearm 106, and independent yaw motion of the wrist member 110 may allow insertion of the substrate 105 into non-focalized process chambers, which include facet normal vectors which are not focalized to a common point, such as the non-focalized process chamber configuration shown in FIG. 2, for example. Facet vector as used herein is defined as an axis in the X-Y plane which is drawn normal to a line projected across an entry (facet) into a process chamber 209A-209F. An example of a facet vector 257 is shown by the dotted line in FIG. 2. In non-focalized systems, the facet vectors 257 do not pass through the shoulder axis 113 of the robot apparatus 100.

Figure 4:
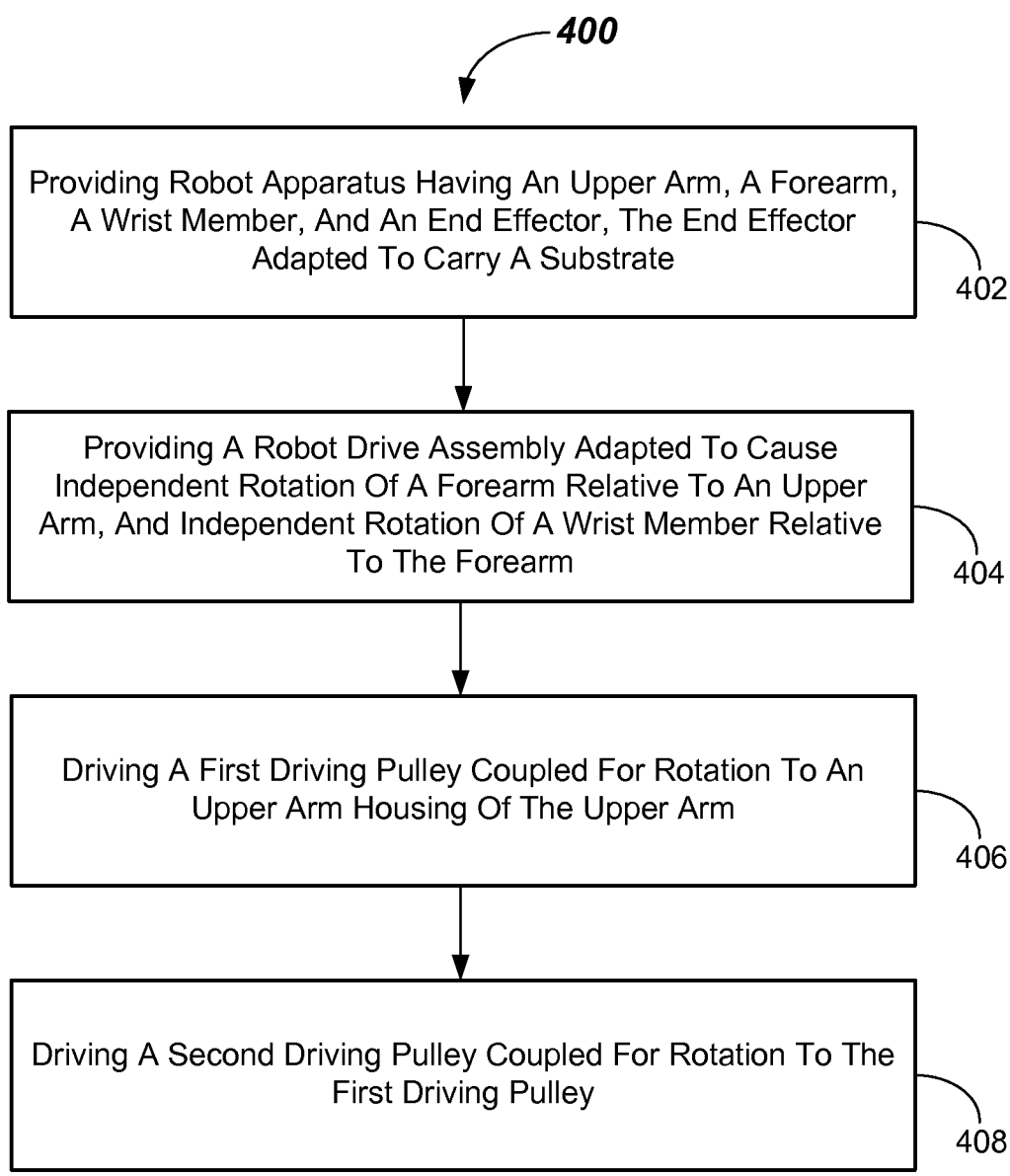
FIG. 4 is a flowchart depicting a method of operating a robot apparatus according to the present invention.

A method of transporting a substrate within an electronic device manufacturing system (e.g., electronic device processing system 101) according to some embodiments of the present invention is provided in FIG. 4. According to the method 400, in 402, a robot apparatus is provided having an upper arm (e.g., upper arm 102), forearm (e.g., forearm 106), a wrist member (e.g., wrist member 110), and an end effector (e.g., end effector 112), which are provided in a chamber (e.g., transfer chamber 107), such as a vacuum transfer chamber. The end effector (e.g., end effector 112) is adapted to carry a substrate (e.g., substrate 105).

In 404, the wrist member (e.g., wrist member 110) is independently rotated in the X-Y plane by a remote motive power device (e.g., second drive motor 114B) mounted outside the chamber (e.g., transfer chamber 107). For example, the wrist member (e.g., wrist member 110) may be rotated in the X-Y plane through a connection with a drive assembly (e.g., drive assembly 115) described herein which couples the wrist member (e.g., wrist member 110) to the remote motive power device (e.g., second drive motor 114B). The motive power device (e.g., second drive motor 114B) may be an electric motor received in a motor housing which may be located outside of the chamber (e.g., transfer chamber 107), for example.

The method 400 includes, in 406, an operation of driving a first driving pulley (e.g., first driving pulley 116) coupled for rotation to an upper arm housing (e.g., upper arm housing 104) of the upper arm (e.g., upper arm 102), and, in 408, an operation of driving a second driving pulley (e.g., second driving pulley 118) coupled for rotation to the first driving pulley (e.g., first driving pulley 116). The coupling for rotation may be through a second pilot 124 and a second bearing 126.

In one aspect, it will become apparent that embodiments of the present invention are adept at servicing non-focalized as well as focalized chambers regardless of where the robot apparatus 100 may be positioned within the transfer chamber 107. As depicted, the wrist member 110 and coupled end effector 112 may be inserted into a non-focalized process chamber 209A-209F through a slit valve at other than a perpendicular orientation to a facet thereof. The forearm 106 and the wrist member 110 may be oriented, as needed, to provide suitable clearance from the walls of the transfer chamber 107 during the motion, yet be oriented to provide extra reach or motion capability to service such non-focalized process chambers 209A-209F.

Another embodiment of robot apparatus 500 and components thereof is shown in FIGS. 5A-5E. From an external perspective, the robot apparatus 500 is identical to the robot apparatus 100 shown in FIG. 1A and includes an upper arm 502, forearm 506, and wrist member 510. However, a different construction of a robot drive assembly 515 is used as compared to that disclosed in FIGS. 1C-1F. In particular, in this embodiment, cross talk between various pulleys is avoided. Furthermore, assembly of the robot drive assembly 515 may be achieved via gravity assembly methods, i.e., dropping all components in from a top where gravity holds them in place while assembly takes place.

In more detail, the robot drive assembly 515 is adapted to cause independent rotation of a forearm 506 relative to an upper arm 502, and independent rotation of a wrist member 510 relative to the forearm 506 in the robot apparatus 500. Robot drive assembly 515 extends between an inboard end 504A and an outboard end 504B of the upper arm 502, and includes a first pilot 520 (e.g., tubular pilot) extending away from a base 523 of the upper arm housing 504, and a first driving pulley 516 coupled for rotation to the first pilot 520. Robot drive assembly 515 includes a second pilot 524 (e.g., tubular pilot) extending away from a web 504W of the upper arm housing 504, and a second driving pulley 518 coupled for rotation to the second pilot 524.

In the depicted embodiment, the first pilot 520 may be integral with a detachable base portion 523D of a base 523 of the upper arm housing 504, and may be attachable to the underside of the main body 504M of the upper arm housing 504 by fasteners (e.g., bolts, screws or the like). As depicted, the second pilot 524 may be integral with a detachable adapter 525 that couples to a web 504W of the upper arm housing 504 by suitable fasteners. In other embodiments, adapter 525 may be made integral with the main housing portion 504M.

In the depicted embodiment, the base 523, and, in particular, the detachable base portion 523D of the upper arm housing 504 is configured to couple to a first drive shaft 521A, which couples to a drive motor (not shown) like first drive motor 114A. A first shaft connector 528 may be provided and is configured to couple the first driving pulley 516 to a second drive shaft 521B, which couples to a drive motor (not shown) like second drive motor 114B. Likewise, a second shaft connector 530 may be provided and is configured to couple the second driving pulley 518 to a third drive shaft 521C, which couples to a drive motor (not shown) like third drive motor 114C.

As shown, the first shaft connector 528 is positioned between the first pilot 520 and the second pilot 524. First shaft connector 528 includes a shaft clamp 527 (e.g., a shaft friction lock) on one end to secure the first shaft connector 528 to the second drive shaft 521B. The other end of the first shaft connector 528 is attached to a top side of the first driving pulley 516 proximate a bottom of a detachable adapter 525 by fasteners (e.g., screws, bolts, or the like).

Second shaft connector 530 extends between a terminal end of the second pilot 524 and the top 504T of the upper arm housing 504. Top 504T of the upper arm housing 504 is detachable from the main body 504M as shown, and is attachable by fasteners (e.g., screws, bolts, or the like). Second shaft connector 530 includes a second shaft clamp 531 (e.g., shaft friction lock) on one end to secure the second shaft connector 530 to the third drive shaft 521C. The other end of the second shaft connector 530 is attached to a top side of the second driving pulley 518 proximate a bottom of the top 504T by fasteners (e.g., screws, bolts, or the like).

Each of the first and second driving pulleys 516, 518 are mounted for rotation on the respective first and second pilots 520, 524 by first and second bearings 522, 526. Suitable bearing retainers may be provided to secure and preload first and second bearings 522, 526. The outboard end 504B of the upper arm 502 and the driven components of the robot drive assembly 515 in this embodiment are identical to the construction shown and described with reference to FIG. 1F. The first and second driving pulleys 516, 518 drive the first and second driven pulleys 132, 134 (FIG. 1E) via first and second transmission members 152, 154 (e.g., metal belts—see FIG. 1C).

Figure 5A:
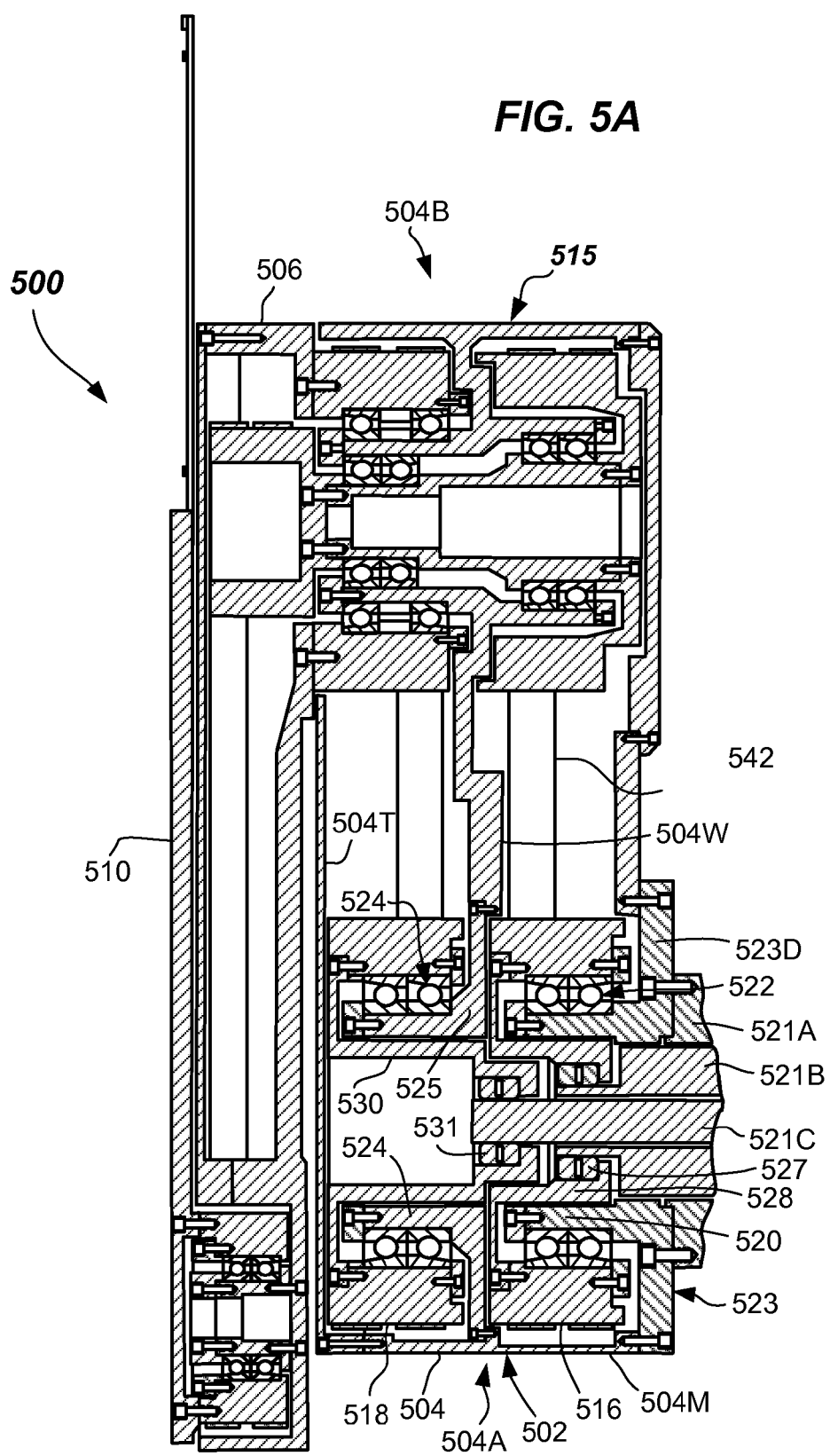
FIG. 5A illustrates a cross-sectional side view of another embodiment robot apparatus according to embodiments.
Figure 5B:
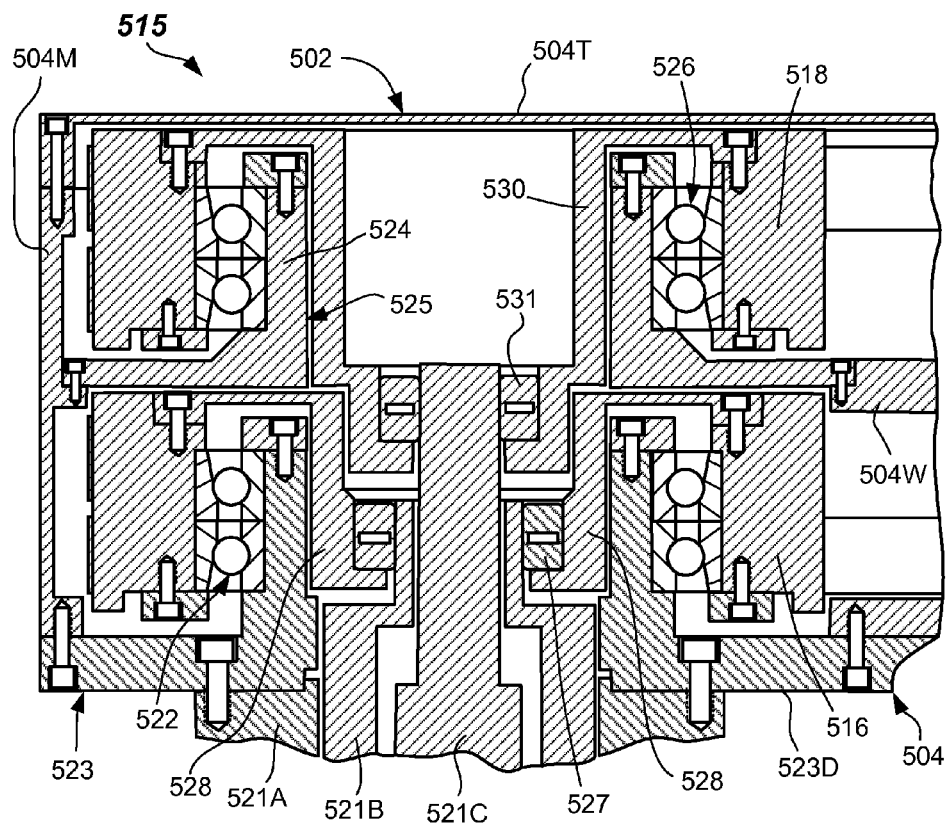
FIG. 5B illustrates a cross-sectional partial side view of an inboard end of a robot drive assembly of a robot apparatus according to embodiments.
Figure 5C:
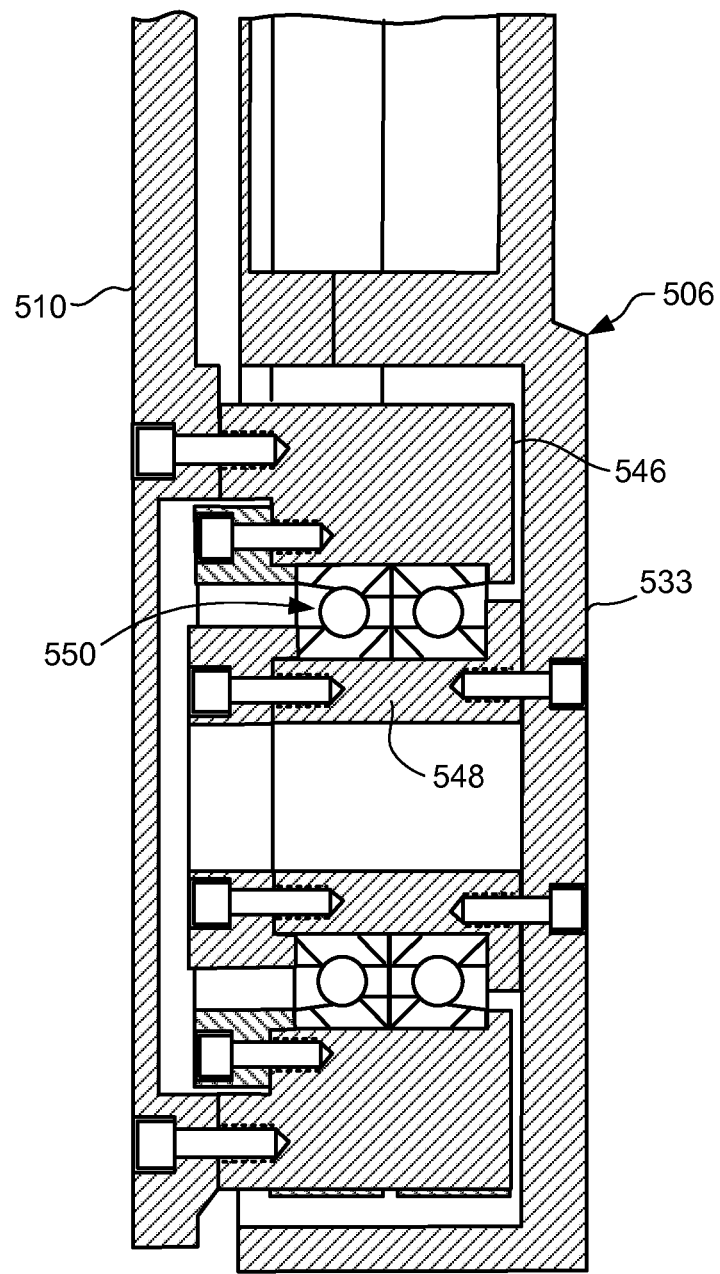
FIG. 5C illustrates a cross-sectional partial side view of a wrist joint showing the connection between the forearm and wrist member of a robot apparatus according to embodiments.

FIG. 5C illustrates a detailed view of the wrist joint of the robot apparatus 500. A wrist member driven pulley 546 is rotationally mounted to the forearm housing 533 of the forearm 506 via the forearm pilot 548 and wrist member support bearing 550. Rotation of the wrist member driven pulley 546 is accomplished via rotation of the drive motor and second drive shaft 521B, which rotates the first driving pulley 516 and first driven pulley 132 through first transmission member 152. Rotation of the first driven pulley 132 rotates transfer shaft 142 and wrist member driving pulley 144, which in turn drives third transmission member 156, which is coupled to wrist member driven pulley 546. Wrist member 510 is fastened to wrist member driven pulley 546 by fasteners (bolts, screws or the like). Thus, rotation of the wrist member driven pulley 546 rotates the wrist member 510 and the end effector 112.

Figure 5D:
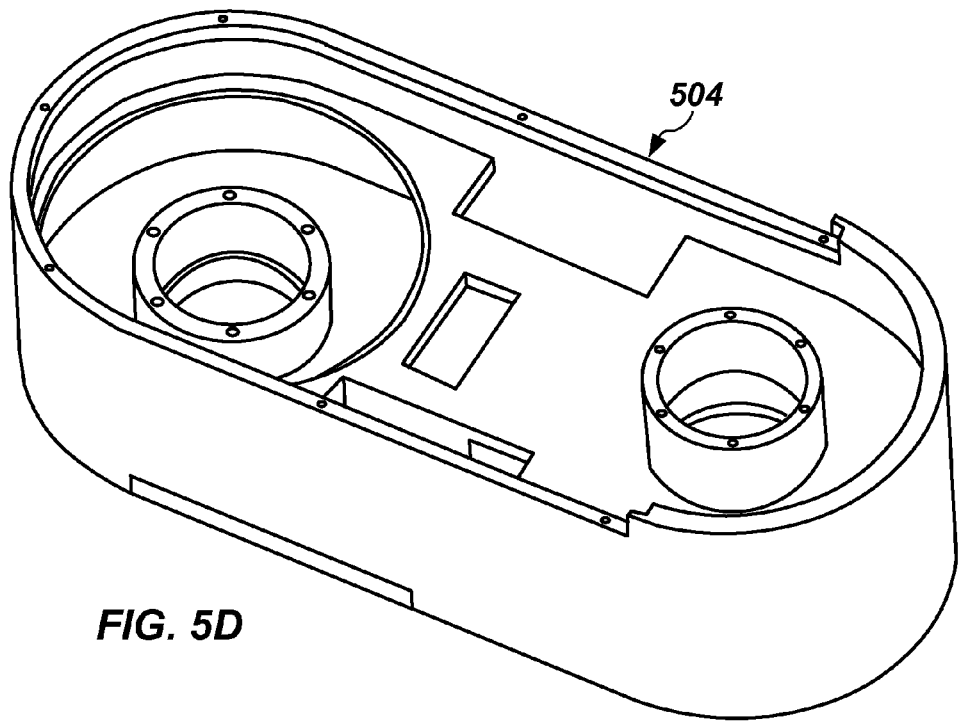
FIGS. 5D-5E illustrates top views of an upper arm housing of a robot apparatus according to embodiments.
Figure 5E:
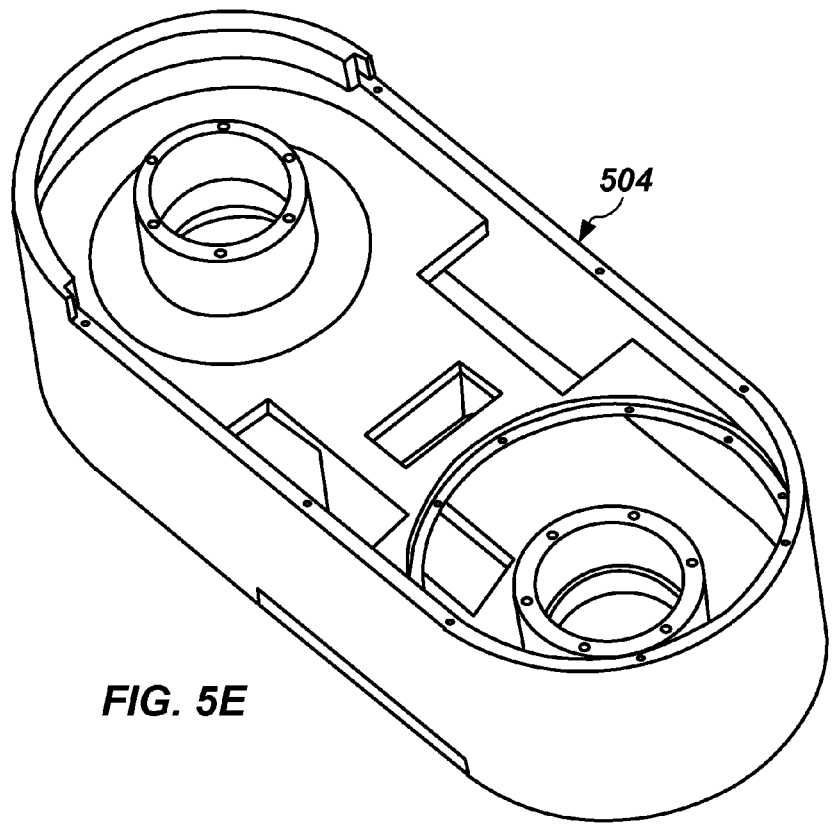
Figure 5F:
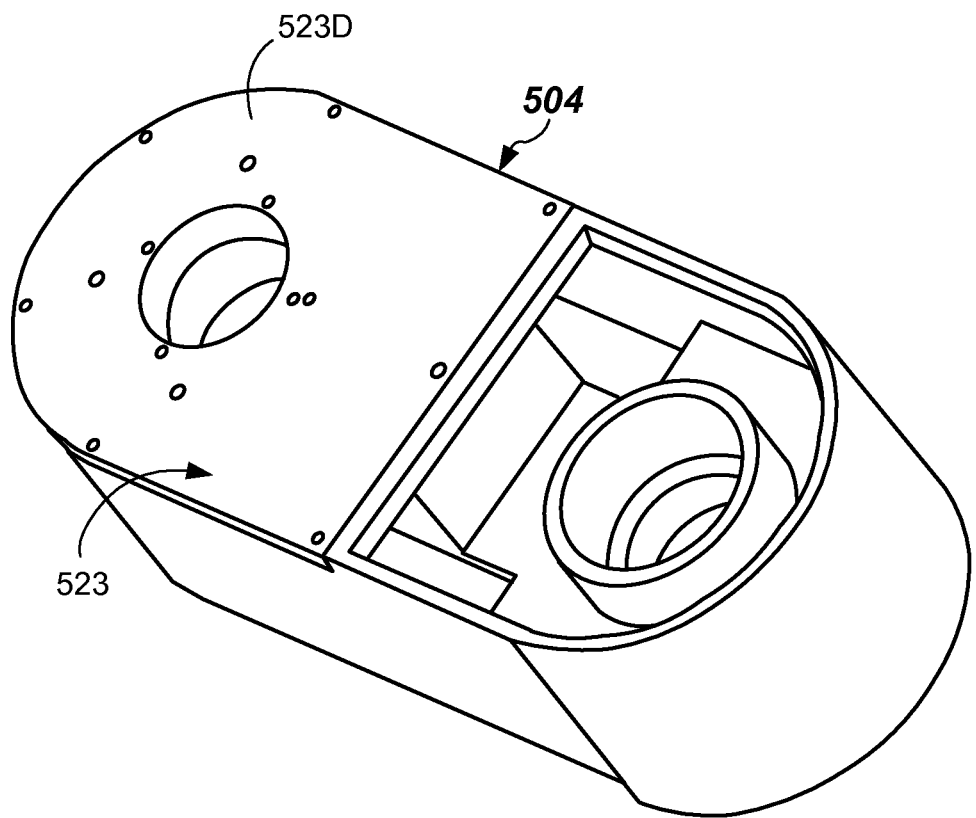
FIG. 5F illustrates a bottom views of an upper arm housing of a robot apparatus according to embodiments.

FIGS. 5D-5E illustrates a top and bottom views of the upper arm housing 504 of this embodiment of the robot apparatus 500.

This embodiment of the robot drive assembly 515 may be assembled by building from the detachable base portion 523D upward, wherein each successive component is dropped in place and suitably attached.

Having shown the preferred embodiments, those skilled in the art will realize many variations are possible that will still be within the scope of the claimed invention. Therefore, it is the intention to limit the invention only as indicated by the scope of the claims.

The invention claimed is:

1. A robot apparatus, comprising:
   an upper arm including an upper arm housing having an inboard end and outboard end;
   a forearm having a forearm housing coupled for rotation to the upper arm housing at the outboard end;
   a wrist member coupled for rotation to the forearm housing;
   an end effector coupled to the wrist member and configured and adapted to carry a substrate; and
   a drive assembly configured and adapted to cause independent rotation of the forearm relative to the upper arm, and independent rotation of the wrist member relative to the forearm, both in an X-Y plane, the drive assembly further including:
   a first driving pulley coupled for rotation to a first pilot of the upper arm housing, and
   a second driving pulley coupled for rotation to a second pilot attached to a top of the first driving pulley, wherein the first driving pulley and the second driving pulley have a first common axis,
   a first driven pulley coupled directly to the first driving pulley by a first transmission member, and
   a second driven pulley coupled directly to the second driving pulley by a second transmission member, wherein the first driven pulley and the second driven pulley have a second common axis.

2. The robot apparatus of claim 1, wherein the upper arm housing comprises a first pilot, wherein the first driving pulley is coupled for rotation to the first pilot by a first bearing.

3. The robot apparatus of claim 1, comprising a second pilot attached to the first driving pulley, wherein the second driving pulley is coupled for rotation to the second pilot by a second bearing.

4. The robot apparatus of claim 1 comprising:
   a lower pilot and an upper pilot extending from a web of an outboard end of the upper arm housing; wherein:
   the first driven pulley is coupled for rotation relative to the lower pilot; and
   the second driven pulley is coupled for rotation relative to the upper pilot.

5. The robot apparatus of claim 4, comprising a transfer shaft coupling the first driven pulley to a wrist member driving pulley, wherein the transfer shaft is supported for rotation by both the lower pilot and the upper pilot by transfer shaft support bearings.

6. The robot apparatus of claim 4, wherein an inboard end of the forearm is directly attached to the second driven pulley.

7. The robot apparatus of claim 1, further comprising a wrist member driven pulley attached to the wrist member.

8. The robot apparatus of claim 7, wherein the wrist member driven pulley is coupled for rotation to a forearm pilot by a wrist member support bearing.

9. The robot apparatus of claim 1 comprising a first shaft connector extending overtop of a first pilot of the upper arm housing, the first shaft connector coupling to a top of the first driving pulley.

10. The robot apparatus of claim 1 comprising a second shaft connector extending overtop of a second pilot of the upper arm housing, the second shaft connector coupling to a top of the second driving pulley.

11. A robot drive assembly adapted to cause independent rotation of a forearm relative to an upper arm, and independent rotation of a wrist member relative to the forearm, the robot drive assembly comprising:
    a first driving pulley coupled for rotation to an upper arm housing of the upper arm;
    a second pilot attached to a top of the first driving pulley, the second pilot having a cylindrical shape that extends from the top of the first driving pulley;
    a second driving pulley coupled for rotation to the second pilot;
    a first driven pulley coupled directly to the first driving pulley by a first transmission member; and
    a second driven pulley coupled directly to the second driving pulley by a second transmission member; wherein:
    the first driving pulley, the second pilot, and the second driving pulley have a first common axis; and
    the first driven pulley and the second driven pulley have a second common axis.

12. The robot drive assembly of claim 11, further comprising:
    a lower pilot and an upper pilot extending from a web of an outboard end of an upper arm housing of the upper arm; wherein:
    the first driven pulley is coupled for rotation to the lower pilot; and
    the second driven pulley is coupled for rotation to the upper pilot.

13. The robot drive assembly of claim 12, comprising a transfer shaft coupling the first driven pulley to a wrist member driving pulley, wherein the transfer shaft is supported for rotation by both the lower pilot and the upper pilot by transfer shaft support bearings.

14. A robot drive assembly adapted to cause independent rotation of a forearm relative to an upper arm, and independent rotation of a wrist member relative to the forearm, the robot drive assembly comprising:
    a first driving pulley coupled for rotation to a first pilot of an upper arm housing of the upper arm;
    a second driving pulley coupled for rotation to the first driving pulley;
    a lower pilot and an upper pilot extending from a web of an outboard end of the upper arm housing;
    a first driven pulley coupled for rotation to the lower pilot and coupled directly to the first driving pulley by a first transmission member;
    a second driven pulley coupled for rotation to the upper pilot, coupled directly to the second driving pulley by a second transmission member, the second driven pulley attached to the forearm; and
    a transfer shaft coupled to the first driven pulley and a wrist member driving pulley; wherein:
    the first driven pulley is vertically aligned with the second driven pulley.

15. A robot drive assembly adapted to cause independent rotation of a forearm relative to an upper arm, and independent rotation of a wrist member relative to the forearm in a robot apparatus, the robot drive assembly comprising:
    a first pilot coupled to and extending away from a base of an upper arm housing in a first direction;
    a first driving pulley coupled for rotation to the first pilot by a first bearing;
    a second pilot coupled to and extending away from a web of the upper arm housing in the first direction; and
    a second driving pulley coupled for rotation to the second pilot by a second bearing; wherein:
    the first pilot, the first driving pulley, the second pilot, and the second driving pulley have a common axis in the upper arm housing.

16. The robot drive assembly of claim 15, wherein the first pilot is integral with a detachable base portion of a base of the upper arm housing.

17. The robot drive assembly of claim 15, wherein the second pilot is integral with a detachable adapter that couples to a web of the upper arm housing.

18. The robot drive assembly of claim 15, wherein the base of the upper arm housing is configured to couple to a first shaft.

19. The robot drive assembly of claim 15, comprising:
a first shaft connector configured to couple the first driving pulley to a second drive shaft.

20. The robot drive assembly of claim 19, wherein the first shaft connector is positioned between the first pilot and the second pilot.

21. The robot drive assembly of claim 15, comprising:
a second shaft connector configured to couple the second driving pulley to a third drive shaft.

22. The robot drive assembly of claim 21, wherein the second shaft connector extends between a terminal end of the second pilot and a top of the upper arm housing.

23. A robot apparatus, comprising:
an upper arm including an upper arm housing having an inboard end and outboard end;
a forearm having a forearm housing coupled for rotation to the upper arm housing at the outboard end;
a wrist member coupled for rotation to the forearm housing;
an end effector coupled to the wrist member and configured and adapted to carry a substrate; and
a robot drive assembly configured and adapted to cause independent rotation of the forearm relative to the upper arm, and independent rotation of the wrist member relative to the forearm, both in an X-Y plane, the robot drive assembly further including:
a first pilot coupled to and extending away from a base of the upper arm housing,
a first driving pulley coupled for rotation to the first pilot,
a second pilot coupled to and extending away from a web of the upper arm housing, and
a second driving pulley coupled for rotation to the second pilot; wherein:
the first pilot, the first driving pulley, the second pilot, and the second driving pulley have a common axis in the upper arm housing.

* * * * *